United States Patent
Omae et al.

(10) Patent No.: US 8,203,859 B2
(45) Date of Patent: Jun. 19, 2012

(54) HIGH FREQUENCY DEVICE WITH VARIABLE FREQUENCY AND VARIABLE LOAD IMPEDANCE MATCHING

(75) Inventors: Shuji Omae, Osaka (JP); Kosuke Maeda, Osaka (JP); Ryohei Tanaka, Osaka (JP); Hideo Ito, Osaka (JP)

(73) Assignee: Daihen Corporation, Osaka (JP)

( * ) Notice: Subject to any disclaimer, the term of this patent is extended or adjusted under 35 U.S.C. 154(b) by 261 days.

(21) Appl. No.: 11/954,436

(22) Filed: Dec. 12, 2007

(65) Prior Publication Data

US 2008/0158927 A1    Jul. 3, 2008

(30) Foreign Application Priority Data

Dec. 29, 2006  (JP) ................................ 2006-356787
Mar. 30, 2007  (JP) ................................ 2007-093974

(51) Int. Cl.
*H02M 5/00* (2006.01)
*H02P 11/00* (2006.01)

(52) U.S. Cl. ...................................................... 363/165

(58) Field of Classification Search .................. 363/157, 363/165; 324/600, 642, 646, 601; 333/17.3, 333/99 PL
See application file for complete search history.

(56) References Cited

U.S. PATENT DOCUMENTS

| | | | |
|---|---|---|---|
| 7,292,047 B2 | 11/2007 | Tanaka et al. | |
| 2003/0184319 A1* | 10/2003 | Nishimori et al. | 324/684 |
| 2006/0220573 A1* | 10/2006 | Kotani et al. | 315/111.21 |
| 2006/0220574 A1 | 10/2006 | Ogawa | |

FOREIGN PATENT DOCUMENTS

| | | |
|---|---|---|
| JP | 62-63183 | 3/1987 |
| JP | 8-253862 | 10/1996 |
| JP | 9-55347 | 2/1997 |
| JP | 2000-150478 | 5/2000 |
| JP | 2003-234335 | 8/2003 |
| JP | 2004-270539 | 9/2004 |
| JP | 2006-286254 | 10/2006 |
| JP | 2006-286306 | 10/2006 |
| JP | 2006-310245 | 11/2006 |

OTHER PUBLICATIONS

English language Abstract of JP 2006-310245.
English language Abstract of JP 2006-286254.
Japan Office action, dated Aug. 23, 2011 along with an english translation thereof.

* cited by examiner

*Primary Examiner* — Harry Behm
*Assistant Examiner* — Matthew Grubb
(74) *Attorney, Agent, or Firm* — Greenblum & Bernstein, P.L.C.

(57) ABSTRACT

A high frequency device for supplying a high frequency power to a load, the high frequency device includes: an oscillating unit that can vary an oscillation frequency; a high frequency power supplying unit that serves as a power source by amplifying an oscillation signal output from the oscillating unit for supplying the high frequency power to the load; a reflected-wave information calculating unit that calculates reflected wave information on a reflected wave power, and outputs the reflected wave information; a frequency control unit that controls the oscillation frequency of the oscillating unit so as to lower the reflected wave information; an impedance adjusting unit that is disposed at a downstream of the high frequency power supplying unit in a power supplying direction, and that has at least one variable reactance element which can be controlled; and an element control unit that controls the variable reactance element of the impedance adjusting unit so as to lower the reflected wave information.

13 Claims, 7 Drawing Sheets

HIGH FREQUENCY DEVICE WITH VARIABLE FREQUENCY AND VARIABLE LOAD IMPEDANCE MATCHING

BACKGROUND OF THE INVENTION

1. Technical Field of the Invention

The present invention relates to a high-frequency device for supplying power to a load, such as a plasma processing device that performs, for example, plasma etching and plasma CVD.

2. Related Art

In the load such as a plasma processing device that performs, for example, plasma etching and plasma CVD, an impedance of the load varies every moment in accordance with progress of a manufacturing process. In order to effectively supply power to the load, it is necessary to adjust an impedance (hereinafter, it is referred to as a load side impedance ZL) on the load side seen from an output terminal of the high-frequency power supplier in accordance with variation of the load impedance Z1 (an impedance corresponding to the load). Hence, generally, not only the high-frequency power supplier for supplying the high frequency power, but also an impedance adjuster for adjusting the load side impedance ZL is combined and has been used.

In addition, a reflected wave power reaches the minimum when a power side impedance Z0 and the load side impedance ZL are matched to each other, where a power side impedance Z0 is an impedance of the power source side seen from the output terminal of the high-frequency power supplier. Additionally, an absolute value of reflection coefficient Γ reaches the minimum too. Consequently, it is possible to lower the reflected wave power by adjusting the load side impedance ZL.

There has been provided a high-frequency power supplier that adjusts the impedance by only using the impedance adjuster, but there has been also provided a variable frequency type high-frequency power supplier that can adjust the load side impedance ZL by changing an output frequency of the high-frequency power supplier in the same manner as Patent Document 1 or 2. In addition, the device including the high-frequency power supplier and the impedance adjuster is referred to as a high frequency device.

FIG. 7 is a diagram illustrating an exemplary configuration of a known high frequency device and connection relationship between the high frequency device and a load 5.

The high-frequency power supplier 50 is a system for supplying the load 5 with high frequency power through the impedance adjuster 6 and has a function of changing the output frequency.

In detail, the high-frequency power supplier 50 outputs the high frequency power by using a power amplifier 53, and high frequency power output value measured by a power meter 54 is controlled so as to reach a target value set by a power setter 56. In addition, the output frequency of the high-frequency power supplier is determined in accordance with an oscillation frequency of the oscillation circuit 52 whose oscillation frequency is controlled by the frequency control circuit 51. The high frequency power output form the high-frequency power supplier 50 is supplied to the load 5 through a transmission line 2 made of coaxial cables, an impedance adjuster 6 and a load connection portion 4 made of a shielded copper plate. In addition, an ON/OFF control circuit 57 controls an ON/OFF output of the oscillation circuit 52, and the oscillation circuit 52 outputs a high frequency signal when ON signal is being output from the ON/OFF control circuit 57. The ON/OFF control circuit 57 is controlled by manipulation of a power output switch, which is not shown in the drawing, disposed in the high-frequency power supplier 50 or by a control signal from an external device.

The impedance adjuster 6 includes reactance elements such as a capacitor and an inductor and adjusts a load side impedance ZL so that the high-frequency power supplier can adjust the reflected wave power by changing the load side impedance ZL as compared with a case where the impedance adjuster is not used. In the example illustrated in FIG. 7, the impedance adjuster includes two capacitors C1 and C2 and an inductor L1. Additionally, reactance values of the reactance elements (capacitance of the capacitor and inductance of the inductor) are fixed values obtained from data obtained by simulation or experiment in accordance with load characteristics.

The load 5 includes a processing section for performing a processing (etching, CVD, or the like) on a target subject such as a wafer, a liquid crystal substrate, or the like carried in the processing section. In the load 5, in order to process the target subject, a plasma discharge gas is injected in the processing section, the high frequency power (voltage) supplied from the high-frequency power supplier 50 is applied to the plasma discharge gas, and thus no-plasma condition is converted into a plasma condition by discharging the plasma discharge gas. Accordingly, the target subject is processed by plasma.

In the aforementioned high-frequency power supplier 50, when the output frequency is changed, the load side impedance ZL also changes, and thus it is possible to lower the reflected wave power by controlling the output frequency.

However, in some cases the reflected wave power may not be sufficiently lowered only by controlling the output frequency of the high-frequency power supplier 50. The reason is because mainly reactance component X is changed and resistance component R is little changed in the load impedance Z1 even by changing the output frequency when the load impedance Z1 is represented by Expression (1). In addition, referring to Expression (1), it is only the reactance component X that changes depending on the change in the output frequency. However, practically, the resistance component R also changes a little bit depending on the change in the output frequency, although the detailed description thereof is omitted here. In addition, in Expression (1), 'f' is the output frequency of the high-frequency power supplier 50, 'C' is the capacitance of the load, and 'L' is the inductance of the load.

$$Z1 = R + jX = R + j(2\pi f L - 1/(2\pi f C)) \quad (1)$$

In addition, there is limitation in the range of reactance component X that is changed by changing the output frequency of the high-frequency power supplier 50, and thus it is not possible to match all load impedance Z1 only by controlling the output frequency of the high-frequency power supplier 50.

Hence, the load side impedance ZL is changed by using the impedance adjuster 6 so as to lower the reflected wave power only by controlling the output frequency of the high-frequency power supplier 50.

Patent Document 1: JP-A-2006-310245
Patent Document 2: JP-A-2006-286254

The high frequency device including the high-frequency power supplier 50 and the impedance adjuster 6 can perform a control operation so as to lower the reflected wave power. However, as described above, the reactance component X is mainly changed and the resistance component R is little changed by changing the output frequency of the high-frequency power supplier. Accordingly, reactance values of the reactance elements in the impedance adjuster 6 are set in advance, so that the resistance component R becomes close to a standard value (for example, 50Ω).

However, since the load impedance Z1 varies every moment, it is not possible to make an optimum setting for every time in a manufacturing process. Hence, for example, reactance of the reactance element is previously set so that the reflected wave power is not more than the reference value in a whole manufacturing process. Specifically, the reactance element of the impedance adjuster 6 has a fixed reactance value. As described above, since the fixed reactance is preferably used in view of an increase in size of device and price, the fixed reactance is employed if possible.

However, in the case where a load has characteristics in which the load impedance Z1 greatly varies throughout the entire manufacturing process, sometimes the reflected wave power may not be sufficiently lowered and may become more than the reference value when using such a high frequency device.

To solve this problem, it can be considered to use an auto impedance matcher, instead of the impedance adjuster, capable of matching impedance by using a method of automatically controlling the variable reactance element using the variable reactance element such as a variable capacitor or a variable inductor. Specifically, the high frequency device mentioned above is configured by combining the variable frequency type high-frequency power supplier 50 with the auto impedance matcher.

However, since the auto impedance matcher controls both of the resistance component R and the reactance component X, the control operation is complicated. Moreover, when using the auto impedance matcher, size of the device and price thereof increase. In addition, when using the auto impedance matcher, there is a possibility that the control operation is unstable since the matching operation by the auto impedance matcher and the adjusting operation of the output frequency by the high-frequency power supplier 50 are performed simultaneously.

In addition, although there is a method of decreasing the reflected wave power in which only an auto impedance matcher automatically performing impedance matching not by using the variable frequency type high-frequency power supplier, but by using a high-frequency power supplier of which output frequency is fixed is used, however, a method in which the variable frequency type high-frequency power supplier is used has a time required for the adjustment for decreasing the reflected wave power shorter than that of the method in which the fixed frequency type high-frequency power supplier is used. Hence, when the adjustment speed in decreasing the reflected wave power is required, it is preferable to employ the high frequency device using the variable frequency type high-frequency power supplier.

SUMMARY OF THE INVENTION

The invention has been made in consideration of the above-mentioned problems, and its object is to provide the high frequency device using the variable frequency type high-frequency power supplier without using the auto impedance matcher and capable of decreasing the reflected wave power even when characteristics of the load thereof has a large variation in the load impedance Z1 throughout the entire manufacturing process.

According to the first aspect of the invention, there is provided a high frequency device for supplying a high frequency power to a load, the high frequency device comprising:

an oscillating unit that can vary an oscillation frequency;

a high frequency power supplying unit that serves as a power source by amplifying an oscillation signal output from the oscillating unit for supplying the high frequency power to the load;

a reflected-wave information calculating unit that calculates reflected wave information on a reflected wave power, and outputs the reflected wave information;

a frequency control unit that controls the oscillation frequency of the oscillating unit so as to lower the reflected wave information;

an impedance adjusting unit that is disposed at a downstream of the high frequency power supplying unit in a power supplying direction, and that has at least one variable reactance element which can be controlled; and an element control unit that controls the variable reactance element of the impedance adjusting unit so as to lower the reflected wave information.

In the high frequency device according to the second invention, the element control unit starts controlling the variable reactance element when the reflected wave information has not become smaller than a reference value although the frequency control unit has controlled the oscillation frequency of the oscillating unit so as to lower the reflected wave information.

In the high frequency device according to the third invention, the frequency control unit does not control the oscillation frequency of the oscillating unit while the element control unit controls the variable reactance element.

In the high frequency device according to the fourth invention, the frequency control unit restarts a control operation when the reflected wave information becomes larger than the reference value again, after the element control unit controls the variable reactance element of the impedance adjusting unit so as to lower the reflected wave information and then the reflected wave information becomes smaller than the reference value.

In the high frequency device according to the fifth invention, the frequency control unit restarts a control operation when the reflected wave information has not become smaller than a reference value although the element control unit has controlled the variable reactance element of the impedance adjusting unit so as to lower the reflected wave information.

In the high frequency device according to the sixth invention, the variable reactance element of the impedance adjusting unit has a function of changing a resistance component of an impedance at a load side rather than the high frequency power supplying unit.

According to the seventh invention, there is provided a high frequency device for supplying high frequency power to a load, the high frequency device comprising:

an oscillating unit that can vary an oscillation frequency;

a high frequency power supplying unit that serves as a power source by amplifying an oscillation signal output from the oscillating unit for supplying the high frequency power to the load;

a reflected-wave information calculating unit that calculates reflected wave information on a reflected wave power, and outputs the reflected wave information;

a frequency control unit that controls the oscillation frequency of the oscillating unit so as to lower the reflected wave information;

an impedance adjusting unit that is disposed at a downstream of the high frequency power supplying unit in a power supplying direction, and that has a plurality of variable reactance elements including two variable reactance elements which can be controlled; and an element control unit that controls any one of the two variable reactance elements of the impedance adjusting unit at a time so as to lower the reflected wave information.

In the high frequency device according to the eighth invention, the element control unit starts controlling one of the two variable reactance elements which can be controlled when the reflected wave information has not become smaller than a reference value although the frequency control unit has controlled the oscillation frequency of the oscillating unit so as to lower the reflected wave information.

In the high frequency device according to the ninth invention, the element control unit starts controlling the other of the two variable reactance elements which can be controlled when the reflected wave information has not become smaller than a reference value although the one of the two variable reactance elements which can be controlled of the impedance adjusting unit has controlled to lower the reflected wave information.

In the high frequency device according to the tenth invention, the frequency control unit does not control the oscillation frequency of the oscillating unit while the element control unit controls the variable reactance element which can be controlled.

In the high frequency device according to the eleventh invention, the frequency control unit restarts a control operation when the reflected wave information becomes larger than the reference value again, after the element control unit controls the variable reactance element which can be controlled of the impedance adjusting unit so as to lower the reflected wave information and then the reflected wave information becomes smaller than the reference value.

In the high frequency device according to the twelfth invention, the frequency control unit restarts a control operation when the reflected wave information does not become smaller than the reference value although the element control unit has controlled the variable reactance element which can be controlled of the impedance adjusting unit so as to lower the reflected wave information.

In the high frequency device according to the thirteenth invention, the one of the two variable reactance elements which can be controlled of the impedance adjusting unit has a function of changing a resistance component of an impedance at a load side rather than the high frequency power supplying unit, and the other of the two variable reactance elements has a function of changing a reactance component of the impedance at the load side rather than the high frequency power supplying unit.

According to the invention, even when the variable frequency type high-frequency power supplier is employed and an auto impedance matcher is not employed, it is possible to control both resistance component R and reactance component X of the load side impedance, and thus it is also possible to lower the reflected wave power. Moreover, adjustment of the resistance component R can be performed by a simple control operation. As a result, for example, throughout the entire manufacturing process, even when a load has characteristics that the load impedance Z1 greatly varies, it is possible to lower the reflected wave power. It may be also possible to perform the control operation so as to lower the absolute value of reflection coefficient.

In addition, even when two variable reactance elements are used, the number of variable reactance elements that can be controlled by the reactance element control circuit 19 at a time while the high frequency power is supplied to the load is one. Hence, it is comparatively easy to control the variable reactance element.

DETAILED DESCRIPTION OF THE INVENTION

Hereinafter, detailed description of the invention will be described with reference to the drawings.

(First Embodiment)

Figure 1:
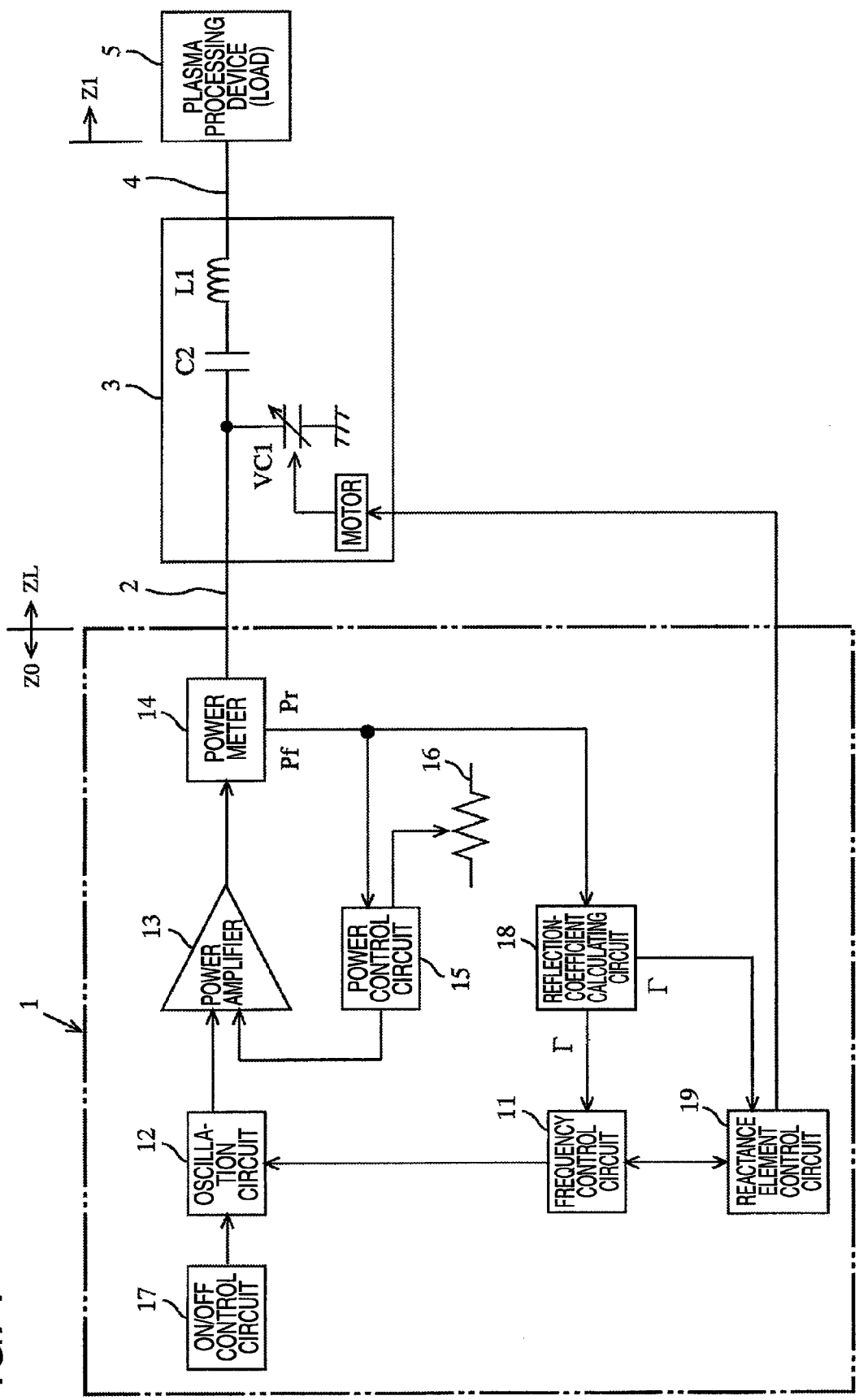
FIG. 1 is a diagram illustrating an exemplary configuration of a high frequency device according to a first embodiment of the invention and connection relation between the high frequency device and a load 5.

FIG. 1 is a diagram illustrating an exemplary configuration of a high frequency device according to a first embodiment of the invention and connection relation between the high frequency device and a load 5. The device including a high-frequency power supplier 1 and an impedance adjuster 3 disposed at a downstream of the high-frequency power supplier 1 in a power supplying direction is referred to as the high frequency device.

The high-frequency power supplier 1 is a system for supplying the load 5 with high frequency power generated by a power amplifier 13 that amplifies a high frequency signal output from an oscillation circuit 12. The high frequency power output from the high-frequency power supplier 1 is supplied to the load 5 through a transmission line 2 formed of a coaxial cable, an impedance adjuster 3, and a load connection portion 4 formed of a shielded copper plate. Generally, such a kind of the high-frequency power supplier 1 outputs high frequency power having a frequency of several hundreds of kHz or more. Additionally, the power amplifier 13 is an example of a high frequency power supplying unit according to the invention.

An ON/OFF control circuit 17 controls an ON/OFF output of the oscillation circuit 12, and the oscillation circuit 12 outputs a high frequency signal when ON signal is being output from the ON/OFF control circuit 17. The ON/OFF control circuit 17 is controlled by manipulation of a power output switch, which is not shown in the drawing, disposed in the high-frequency power supplier 1 or by a control signal from an external device. Additionally, the oscillation circuit 12 is an example of an oscillating unit according to the invention.

In order to control power of the high-frequency power supplier 1, the high frequency signal output from the power amplifier 13 is converted into a power value and measured by a power meter 14 which is disposed on a rear end of the power amplifier 13, and the output of the high frequency is controlled, so that the measured power value is equal to an objective power value which is set in a power setter 16. Specifically, the power control is performed by inputting the measured power value and the objective power value to a power control circuit 15 and outputting a control signal to the power amplifier 13 so as to remove the variation of the measured power value relative to the objective power value.

Additionally, the power meter 14 converts the high frequency output the power amplifier 13 which is a forward wave into a power value and outputs the measured power value of the forward wave. The power meter 14 also converts a reflected wave which is reflected from the load side toward the power amplifier 13 into a power value and outputs the measured value of reflected wave power. For example, the power meter 14 may be configured to include a directional coupler and a conversion circuit for converting an output of the directional coupler into a power value.

In FIG. 1, the object controlled by the power control circuit 15 may be the measured power value of the forward wave and may be the load-side measured power value which is obtained by subtracting the measured power value of the reflected wave from the measured power value of forward wave. Additionally, in FIG. 1, even when the load-side measured power value is the object for the control, a connecting line from the power meter 14 to the power control circuit 15 is drawn as one line in order to simplify drawings. In a reflection-coefficient calculating circuit 18 to be described later, the measured power values of the forward wave and the reflected wave output from the power meter 14 is input, but a connecting line from the power meter 14 to the reflection-coefficient calculating circuit 18 is also drawn as one line.

An output frequency of the high-frequency power supplier 1 is determined by an oscillation frequency of the oscillation circuit 12. For example, it is possible to vary the output frequency of the high-frequency power supplier 1 in the range of 13.56 MHz ±α in the way of varying the oscillation frequency of the oscillation circuit 12 in the range of 13.56 MHz ±α. Additionally, the oscillation frequency of the oscillation circuit 12 is controlled by the frequency control circuit 11 such that the reflected wave power is lowered. As for a control method, for example, it is possible to use the method disclosed in Patent Document 1 or Patent Document 2.

As described later, when an absolute value of reflection coefficient Γ does not become less than a reference value (when the absolute value of reflection coefficient is equal to the reference value or more) even though the output frequency of the high-frequency power supplier 1 is controlled, it is necessary to adjust a variable capacitor VC1 of the impedance adjuster 3 by using a reactance element control circuit 19. Hence, the frequency control circuit 11 outputs a control start signal to the reactance element control circuit 19. The frequency control circuit 11 is an example of a frequency control unit according to the invention.

The reflection-coefficient calculating circuit 18 calculates an absolute value of reflection coefficient (hereinafter, it is referred to as the absolute value of reflection coefficient Γ) from the measured power values of forward wave and reflected wave output from the power meter 14 and outputs the calculated absolute value of reflection coefficient Γ. When the measured power value of forward wave is denoted as Pf and the measured power value of reflected wave is denoted as Pr, the absolute value of reflection coefficient Γ is represented as the following expression (2). Additionally, it may be possible to obtain the absolute value of reflection coefficient Γ in a different way from the way described here. The reflection-coefficient calculating circuit 18 is an example of a reflected-wave information calculating unit.

$$\text{Absolute value of reflection coefficient } \Gamma = \sqrt{Pr}/\sqrt{Pf} \qquad (2)$$

The reactance element control circuit 19 controls a variable reactance element in the impedance adjuster 3 to be described later on the basis of the absolute value of reflection coefficient Γ output from the reflection-coefficient calculating circuit 18. The control operation will be described later with reference to FIG. 2. In addition, as described later, when the absolute value of reflection coefficient Γ becomes less than the reference value by controlling the variable reactance element in the impedance adjuster 3, an object to lower the absolute value of reflection coefficient Γ is achieved, and thus the process proceeds back to the control operation performed by the frequency control circuit 11. Hence, the reactance element control circuit 19 outputs a control start signal to the frequency control circuit 11. The reactance element control circuit 19 is an example of an element control unit according to the invention.

For example, the high frequency device illustrated in FIG. 1 controls the output frequency of the high-frequency power supplier 1 and the reactance of the variable reactance element of the impedance adjuster 3 on the basis of the absolute value of reflection coefficient r, but it may be possible to perform the control by using information, which is about the reflected wave power, such as a measured power value of reflected wave Pr, instead of the absolute value of reflection coefficient. According to the invention, the information on the reflected wave power such as the absolute value of reflection coefficient and the measured power value of reflected wave Pr is simply referred to as reflected wave information. The reflected-wave information calculating unit may be configured to obtain the information on the reflected wave power.

The impedance adjuster 3 includes reactance elements such as a capacitor and an inductor. As compared with the case where the impedance adjuster is not used, the impedance adjuster 3 can adjust a load side impedance ZL so that the high-frequency power supplier 1 can adjust the reflected wave power by changing the load side impedance ZL. The impedance adjuster 3 is an example of an impedance adjusting unit according to the invention.

In the example illustrated in FIG. 1, the impedance adjuster 3 includes two capacitors including a variable capacitor VC1 and a fixed capacitor C2 and an inductor L1. By using the reactance elements, the load side impedance ZL is adjusted. The variable capacitor VC1 is controlled by the reactance element control circuit 19. Reactance values of the reactance elements, that is, a variable capacitance range of the variable capacitor VC1 and a capacitance of the fixed capacitor C2 may be appropriately selected from data obtained by simulation or experiment in accordance with load characteristics.

The variable capacitor VC1 can change the capacitance by using a motor (for example, a Step ping motor).

Specifically, the reactance element control circuit 19 changes the capacitance of the variable capacitor VC1 by controlling the motor.

More specifically, the variable capacitor VC1 has a moving member for changing the capacitance, so the capacitor is able to change the capacitance by displacing a position of the moving member. Hence, when the moving member is displaced by using a motor, the capacitance of the variable capacitor VC1 can be changed. Specifically, an impedance of variable reactance element can be changed.

For example, it may be configured that the capacitance increases when the motor is rotated in a clockwise direction and lowers when the motor is rotated in an anticlockwise direction. Specifically, the capacitance of the variable capacitor VC1 can be changed by controlling a moving direction (rotation direction) and movement amount (rotation amount) of the motor.

The reason for disposing a variable type capacitor on a position of the variable capacitor VC1 is that a case where the capacitance of a capacitor disposed in this position is changed can change the resistance component more than a case where the capacitance of a capacitor disposed in a position of the capacitor C2 is changed.

Specifically, the variable capacitor VC1 has a function of changing a resistance component of the load side impedance. More specifically, when the capacitance of the variable capacitor VC1 is changed, the resistance component is changed greater than the reactance component.

By disposing the variable capacitor VC2 on the position of the capacitor C2, when the capacitance is changed, it is possible to change a reactance component greatly. Specifically, when the variable capacitor VC2 is disposed on the position of the capacitor C2, the variable capacitor VC2 has a function of changing the reactance component of the load side impedance. More specifically, when the variable capacitor VC2 is disposed on the position of the capacitor C2, the reactance component is changed greater than the resistance component in accordance with change of the capacitance of the variable capacitor VC2.

In the embodiment, the variable capacitor VC1 is employed as an example of the variable reactance element, but it is also possible to change the inductance by the same use of the motor even when a variable inductor is employed as the variable reactance element.

Additionally, likewise Patent Document 1, by providing a discharge detector 17, which is omitted in FIG. 1, for detecting discharge in the load 5, it may be possible to change the frequency control of the high-frequency power supplier in accordance with occurrence of the discharge.

Figure 2:
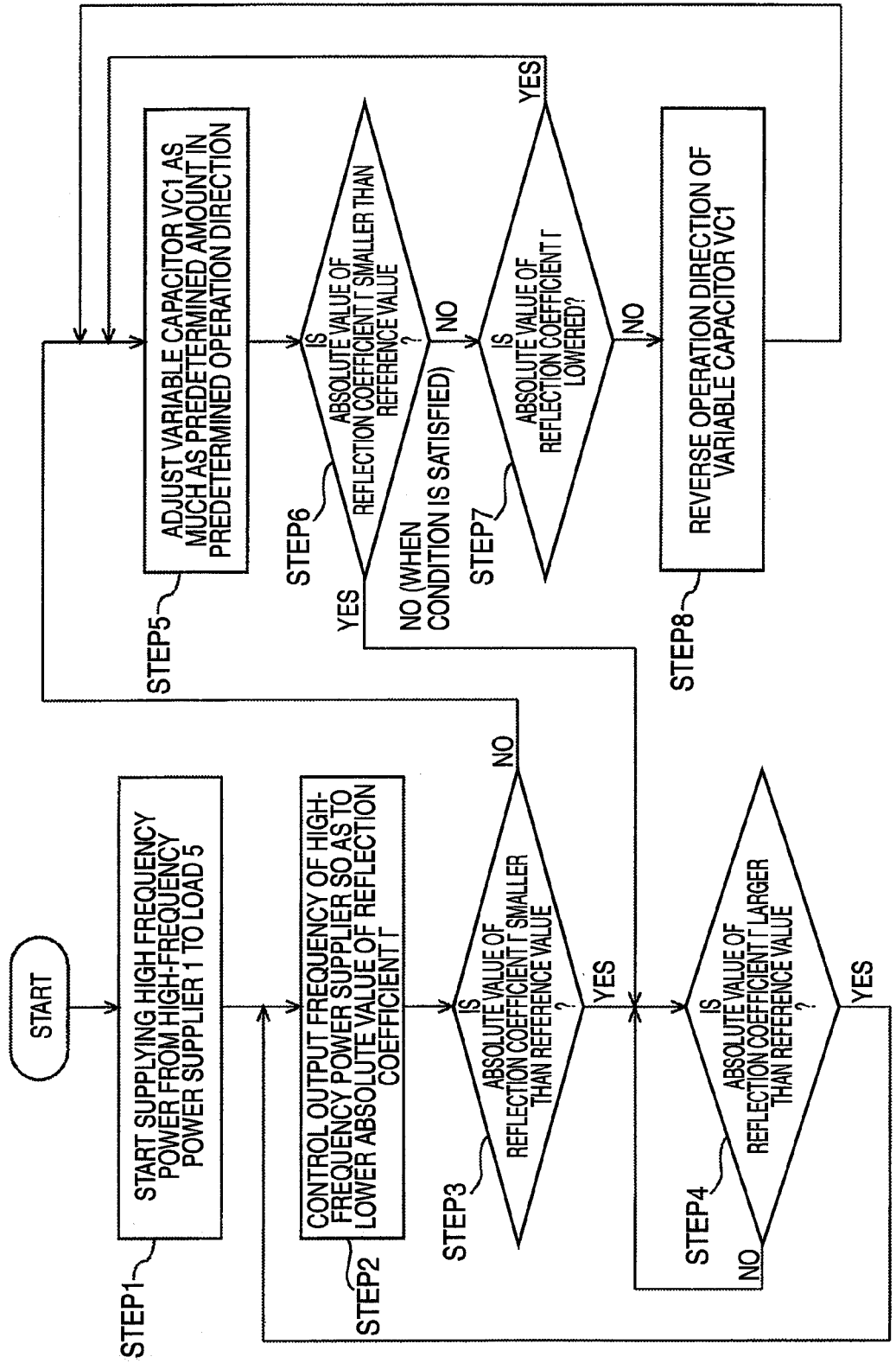
FIG. 2 is an exemplary flowchart illustrating a control method of decreasing an absolute value of reflection coefficient $\Gamma$ by using the high frequency device according to the first embodiment of the invention.

FIG. 2 is an exemplary flowchart illustrating a control method of decreasing the absolute value of reflection coefficient $\Gamma$ by using the high frequency device according to the first embodiment of the invention. The control method of decreasing the absolute value of reflection coefficient $\Gamma$ will be described with reference to the flowchart. As described above, it may be possible to perform the control by using the reflected wave information such as the measured power value of reflected wave Pr, instead of the absolute value of reflection coefficient.

Step 1: supplying high frequency power from the high-frequency power supplier 1 to the load 5 is started. The high frequency power is output from the high-frequency power supplier 1 and is supplied to the load 5, a voltage that becomes greater than a discharge start voltage is applied to gas in a plasma processing device serving as the load 5, and then the voltage is discharged.

Step 2: after the discharge, the output frequency of the high-frequency power supplier 1 by using the frequency control circuit 11 is controlled so as to lower the absolute value of reflection coefficient $\Gamma$. In this step, the output frequency is set by a frequency that is selected from the variable range of output frequencies of the high-frequency power supplier 1 at the minimum absolute value of reflection coefficient r. As might be expected, the output frequency may be determined by other criteria. For example, even when the absolute value of reflection coefficient $\Gamma$ is not the minimum but the second smallest value, the absolute value of reflection coefficient $\Gamma$ may be further stable when considering an absolute value of reflection coefficient $\Gamma$ in the vicinity of the output frequency.

In that case, it may be possible to select the output frequency having the second smallest value in the absolute value of reflection coefficient $\Gamma$.

Step 3: it is determined whether the absolute value of reflection coefficient $\Gamma$ becomes smaller than the reference value by controlling the output frequency of the high-frequency power supplier 1 in Step 2. When the absolute value of reflection coefficient $\Gamma$ is less than the reference value (Yes), the process proceeds to Step 4 since the absolute value of reflection coefficient is sufficiently controlled by only the control of the output frequency of the high-frequency power supplier 1. When the absolute value of reflection coefficient r is not less than the reference value (No), the process proceeds to Step 5 since adjustment in the impedance adjuster 3 is necessary.

Step 4: the absolute value of reflection coefficient F is monitored while a waiting mode is performed and it is determined whether the absolute value of reflection coefficient $\Gamma$ becomes larger than the reference value or not. When the absolute value of reflection coefficient $\Gamma$ becomes larger than the reference value (Yes), the process proceeds to Step 2 since it is necessary to perform again the control of the output frequency of the high-frequency power supplier 1 in order to lower the absolute value of reflection coefficient $\Gamma$. When the absolute value of reflection coefficient $\Gamma$ does not becomes larger than the reference value (No), Step 4 is repeated again.

Step 5: when only controlling the output frequency of the high-frequency power supplier 1 is not enough to lower the absolute value of reflection coefficient $\Gamma$ to be equal to or less than the reference value, Steps 5 to 8 are performed since it is necessary to adjust the load side impedance ZL by using the impedance adjuster 3. In Step 5, the variable capacitor VC1 is operated for the adjustment of a predetermined amount in a predetermined operation direction. Additionally, an initial value thereof may be set in an operation direction in which the capacitance of the variable capacitor lowers. As might be expected, the initial value may set in an operation direction in which the capacitance of the variable capacitor increases. Additionally, when the variable reactance element in the impedance adjuster 3 is controlled by the reactance element control circuit 19, the frequency control circuit 11 does not control oscillation frequency of the oscillation circuit 12. Consequently, an oscillation frequency of the oscillation circuit 12 is maintained at the oscillation frequency used so far.

Step 6: it is determined whether the absolute value of reflection coefficient $\Gamma$ becomes smaller than the reference value or not, from the result that the variable capacitor VC1 is operated in Step 5. When the absolute value of reflection coefficient $\Gamma$ is less than the reference value (Yes), the process proceeds to Step 4 since the absolute value of reflection coefficient $\Gamma$ becomes small. When the absolute value of reflection coefficient $\Gamma$ is not less than the reference value (No), the process proceeds to Step 7 in order to determine whether the operation amount of the variable capacitor VC1 is small or not.

Additionally, in Step 6, when the case where the absolute value of reflection coefficient $\Gamma$ is not less than the reference value (No) is continuously repeated a predetermined number of times, it may be preferable to perform the control operation of output frequency of the high-frequency power supplier 1. Hence, the current step may move to Step 4. As a condition for performing such a process, not only a condition in which the aforementioned case is continuously repeated a predetermined number of times, but also, for example, a condition in which the absolute value of reflection coefficient $\Gamma$ is not less than the reference value during a predetermined time may be used. In this case, a timer is disposed therein. That is, when a predetermined condition is satisfied even though the absolute value of reflection coefficient Γ is not less than the reference value (No), the current step may move to Step 4. Additionally, this case corresponds to the case where the absolute value of reflection coefficient Γ becomes larger than the reference value in step 4 (Yes), and thus the process proceeds to Step 2. Hence, Step 6 may move to Step 2.

Additionally, in the above-described Step, when a predetermined condition is satisfied in the case where the absolute value of reflection coefficient Γ is not less than the reference value (No) (for example, when the case is continuously repeated a predetermined number of times), there is a possibility that an error occurs, and thus an error signal may be configured to be output. The output of the high frequency power of the high-frequency power supplier 1 may be stopped by the error signal.

Step 7: it is determined whether the absolute value of reflection coefficient Γ lowers or not, from the result that the variable capacitor VC1 is operated. When the absolute value of reflection coefficient Γ lowers (Yes), there is a possibility that the operation amount of the variable capacitor VC1 is small, and thus the process proceeds to Step 5. When the absolute value of reflection coefficient Γ does not lower (No), the process proceeds to the Step 8 since there is a possibility that the operation direction of the variable capacitor VC1 is incorrect.

Step 8: When the absolute value of reflection coefficient r does not lower (No) in Step 7, there is a possibility that the operation direction of the variable capacitor VC1 is not right, and thus the process proceeds to Step 5 by reversing the operation direction of the variable capacitor VC1. From the next time, the reversed operation direction in this step becomes an operation direction for the next operation and thereafter. Additionally, since the absolute value of reflection coefficient Γ varies every moment, when the process of Step 8 is performed, particularly, the operation direction may repeatedly change like normal direction→reverse direction→normal direction→reverse direction . . . , so sometimes the control may become unstable. Hence, in order to achieve stability of the control, for example, the same operation direction may be maintained until the case of "No" is repeated a predetermined times.

According to the control operation as described above, even when the variable frequency type high-frequency power supplier is employed and an auto impedance matcher is not employed, it is possible to control both resistance component R and reactance component X of the load side impedance, and thus it is also possible to lower the reflected wave power. Moreover, adjustment of the resistance component R can be performed by a simple control operation. As a result, throughout the entire manufacturing process, even when a load has characteristics that the load impedance Z1 greatly varies, it is possible to lower the reflected wave power. It may be also possible to perform the control operation so as to lower the absolute value of reflection coefficient.

Figure 3:
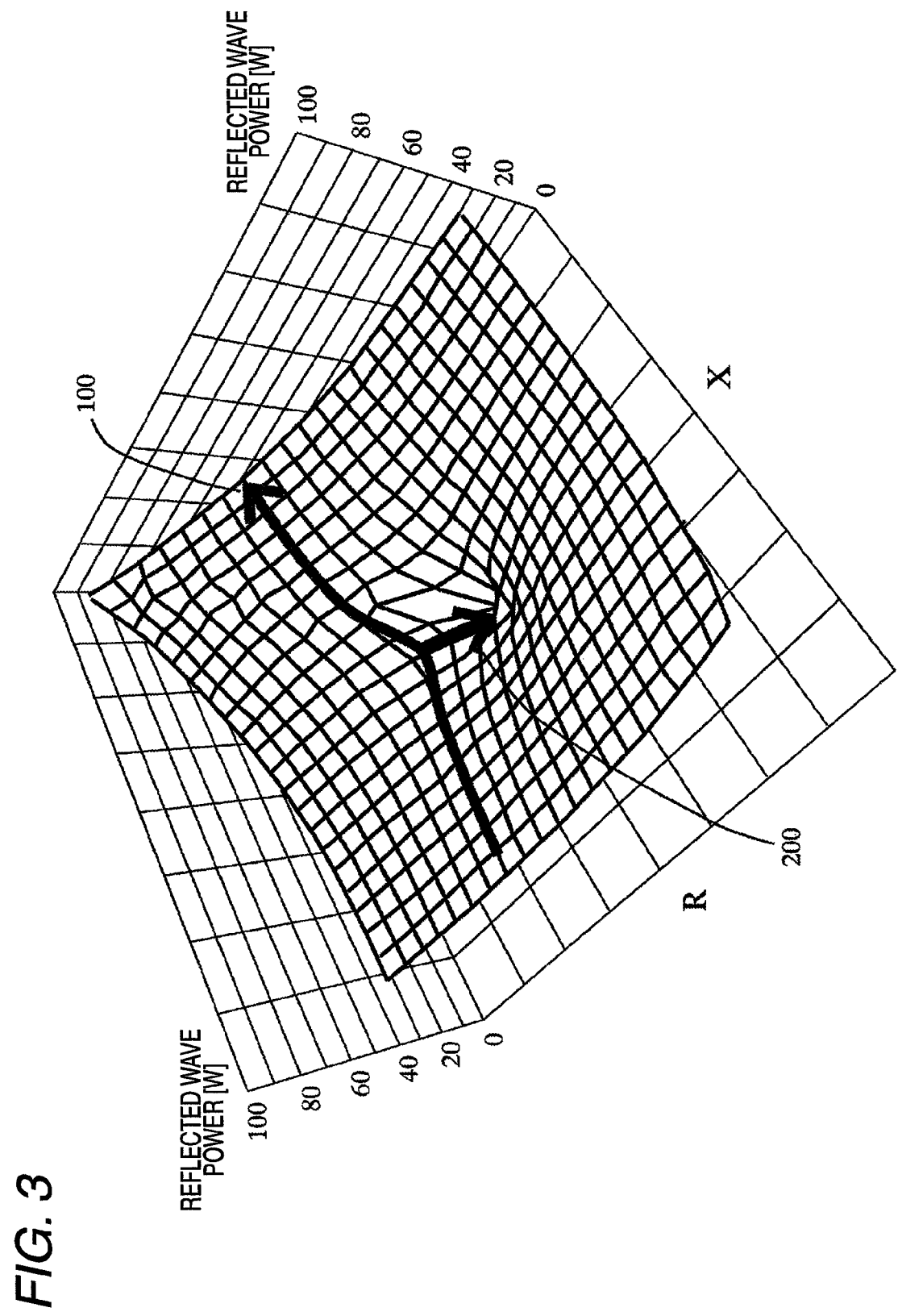
FIG. 3 is a three-dimensional diagram illustrating an example of variation of a reflected wave power.

Referring to FIG. 3, this process will be described for further details. Additionally, until now, the example in which the absolute value of reflection coefficient Γ is controlled to lower has been described, but a description in terms of the reflected wave power will be followed with reference to FIG. 3.

FIG. 3 is a three-dimensional diagram illustrating an example of variation of a reflected wave power. In the drawing, 'R' represents a resistance component, 'X' represents a reactance component, and the vertical axis represents the reflected wave power. Accordingly, the concave portion in the vicinity of the center in the drawing shows a portion where the reflected wave power is smallest.

As described above, the load side impedance ZL is varied by controlling the output frequency of the high-frequency power supplier. At that time, mostly, the reactance component X is varied as described above. An example of trace of the variation in the load side impedance ZL is referred to as a trace 100.

As shown in the example of the trace 100, the reflected wave power lower a little during the process in which the reactance component X varies, but the reflected wave power may not be at the minimum. The reason is, as mentioned above, it is hard to adjust the resistance component R only by controlling the output frequency of the high-frequency power supplier.

Accordingly, for example, the high frequency device according to the invention is configured to supply the high frequency power having an output frequency of which the reflected wave power in the course of the trace 100 is at the minimum. Then, the variable reactance element of the impedance adjuster (in this example, variable capacitor VC1) is controlled, and thus the control operation that adjusts the resistance component R and lowers the absolute value of reflection coefficient Γ is performed. An example of trace of the variation in the load side impedance ZL at this time is referred to as a trace 200. As a result the reflected wave power can lower as compared with the case where only the output frequency of the high-frequency power supplier is controlled.

(Second Embodiment)

Figure 4:
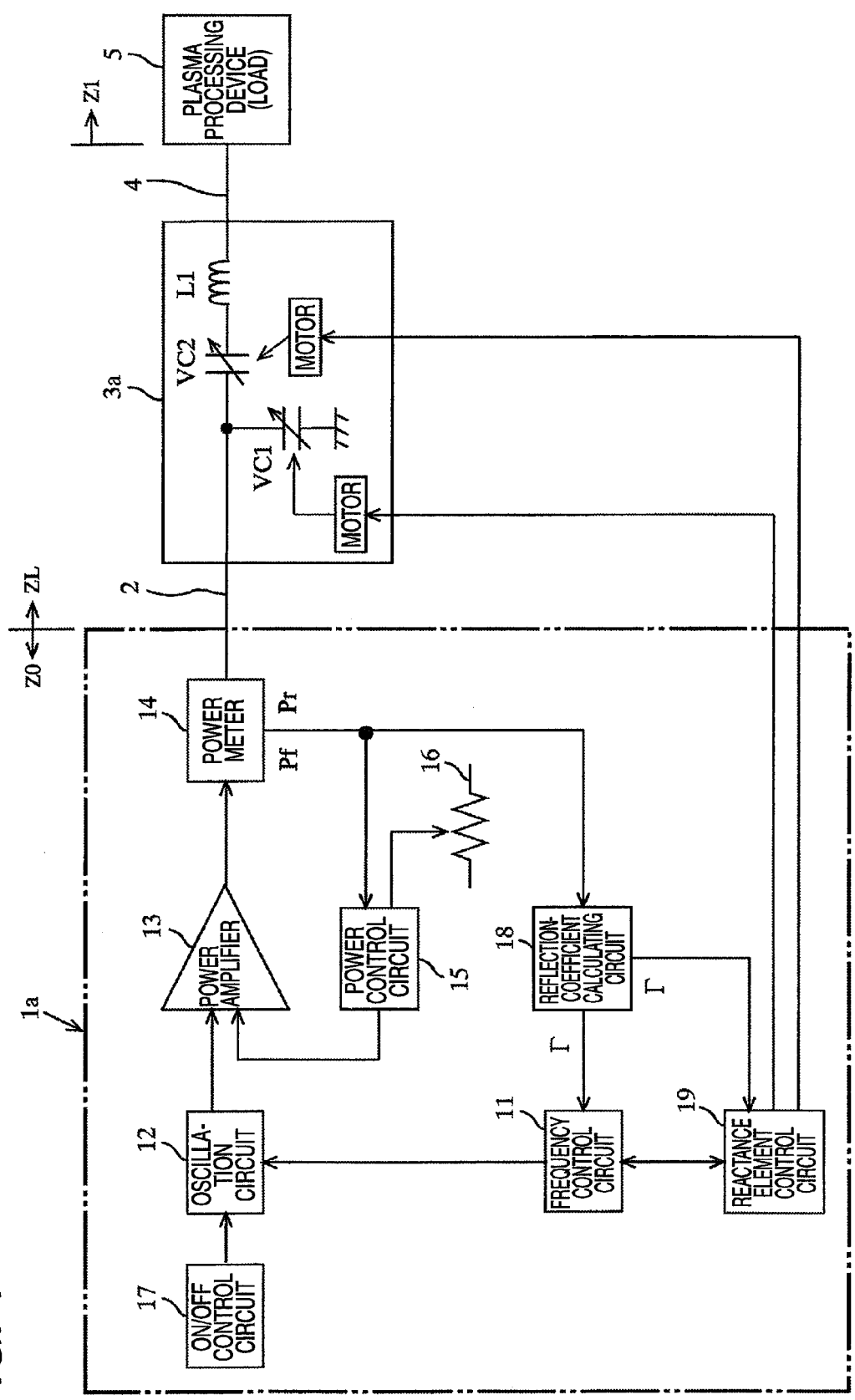
FIG. 4 is a diagram illustrating an exemplary configuration of a high frequency device according to a second embodiment of the invention and connection relation between the high frequency device and the load 5.

FIG. 4 is a diagram illustrating an exemplary configuration of a high frequency device according to a second embodiment of the invention and connection relation between the high frequency device and the load 5. Additionally, a device configured to combine a high-frequency power supplier 1a and an impedance adjuster 3a is referred to as a high frequency device.

In the impedance adjuster 3a shown in FIG. 4, the fixed capacitor C2 of the impedance adjuster 3 shown in FIG. 1 is changed into a variable capacitor VC2. The variable capacitor VC2, likewise the variable capacitor VC1, is configured to change capacitance thereof by using a motor. Additionally, the motor, likewise the variable capacitor VC1, is configured to be controlled by the reactance element control circuit 19.

The high-frequency power supplier 1a is mostly the same as the high-frequency power supplier 1 shown in FIG. 1 but is configured to change the capacitance of the variable capacitor VC2 by controlling the motor for the variable capacitor VC2, as described above. The other description thereof will be omitted since the high-frequency power supplier 1a is the same as the high-frequency power supplier 1 shown in FIG. 1. The reactance element control circuit 19 is referenced by the same reference as shown in FIG. 1.

However, in the first embodiment as described above, reflected wave information is lowered by using one variable capacitor (in the example shown in FIG. 1, the variable capacitor VC1) that is disposed in the high-frequency power supplier of variable frequency type and the impedance adjuster. In most cases, the reflected wave information can be lower than a predetermined value in the same manner as the aforementioned first embodiment. However, rarely, there is a case where the reflected wave information cannot be lowered. This phenomenon will be described with reference to FIG. 5.

Figure 5:
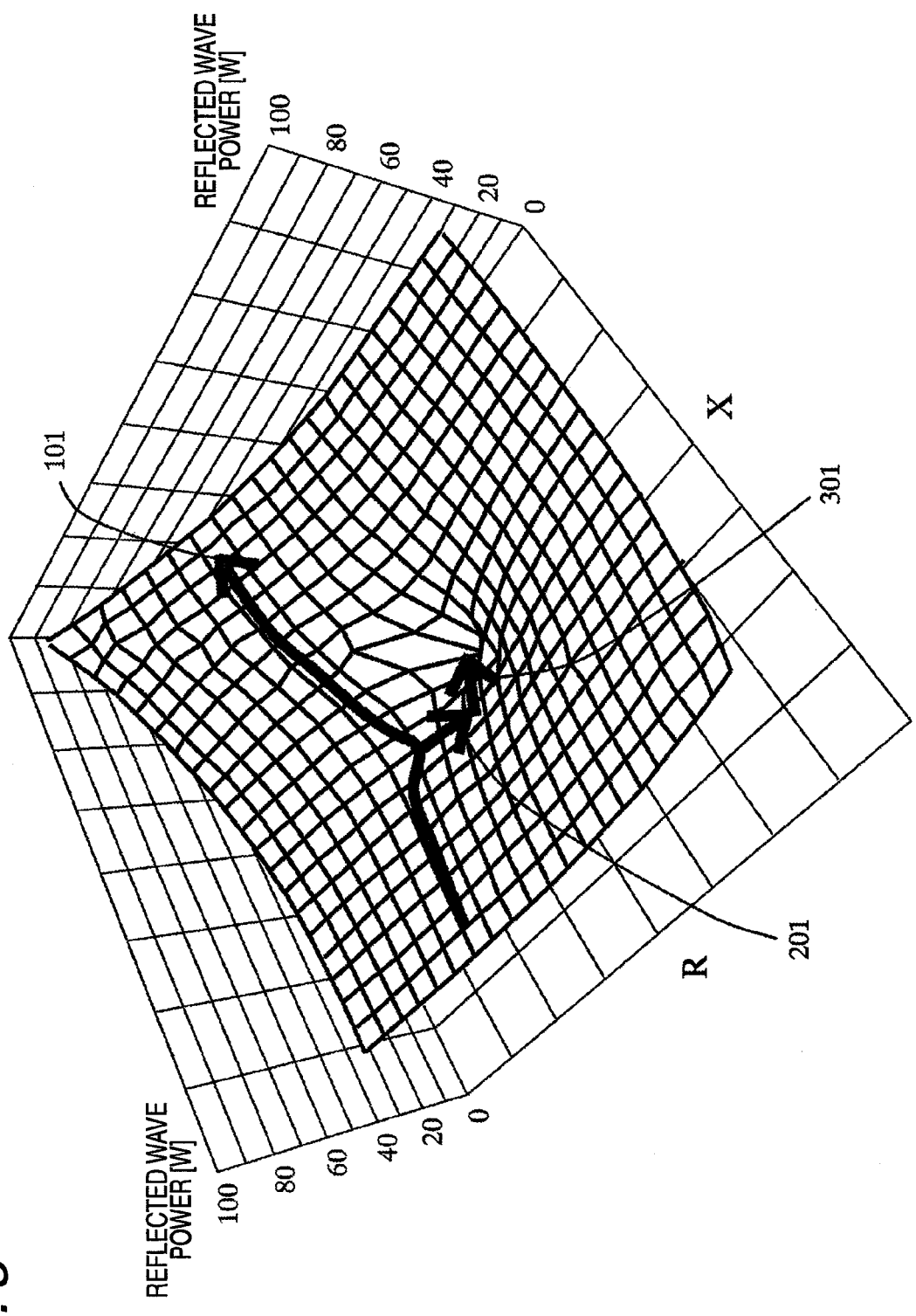
FIG. 5 is a three-dimensional diagram illustrating other example of variation of the reflected wave power.

FIG. 5 is a three-dimensional diagram illustrating other example of variation of the reflected wave power. Coordinates and the like are the same as FIG. 3, and thus the description thereof will be omitted.

As shown in FIG. 5, when the output frequency of the high-frequency power supplier is changed, an example of trace of the variation in the load side impedance ZL is referred to as a trace 101, and when the variable capacitor VC1 of the impedance adjuster is controlled, an example of trace of the variation in the load side impedance ZL is referred to as a trace 201.

As shown in FIG. 5, the output frequency is set in the variable range of the output frequency of the high-frequency power supplier 1 so that the reflected wave power becomes the minimum, and then the capacitance thereof is changed by controlling the variable capacitor VC1, but, nevertheless, it may not be possible to reach the concave portion around the center of the drawing. For the convenience of description, in FIG. 5, the trace 101 and the trace 201 are represented to greatly depart from each other.

The reason for such a case is that the output frequency which is set in the variable range of the output frequency of the high-frequency power supplier 1 so that the reflected wave power reaches the minimum is not an optimum value in the next operation of the variable capacitor VC1. For example, in FIG. 5, the reflected wave power can be further lowered by moving a start point of the trace 201 to the place departing from the original start point of the trace 201 shown in the drawing, in an arrow direction of the trace 101.

Consequently, even when the combination of the control operation of the output frequency of the high-frequency power supplier 1 and the control operation of the variable capacitor VC 1 is used, the reflected wave power may not be the minimum.

In such a case, in the same manner as the special example (when the condition is satisfied even in 'No' state, the step moves to Step 4 or Step 2) shown in 'Step 6' of the aforementioned flowchart in FIG. 2, it is a way that the high-frequency power supplier 1a controls the output frequency again, but, nevertheless, the situation may not become better. Accordingly, in this case, it is preferred that the fixed capacitor C2 is changed into the variable capacitor VC2, and capacitance of the variable capacitor VC2 is changed, as shown in FIG. 4. With such a configuration, the situation becomes different with before the change, and thus the problem that cannot be solved only by changing the output frequency of the high-frequency power supplier 1a and the capacitance of the variable capacitor VC1 may be solved. For example, when capacitance of the variable capacitor VC2 is changed, it is possible to change the load side impedance ZL like the trace 301. Therefore, the trace may reach the concave portion (the portion where the reflected wave power is small) in the vicinity of the drawings.

Figure 6:
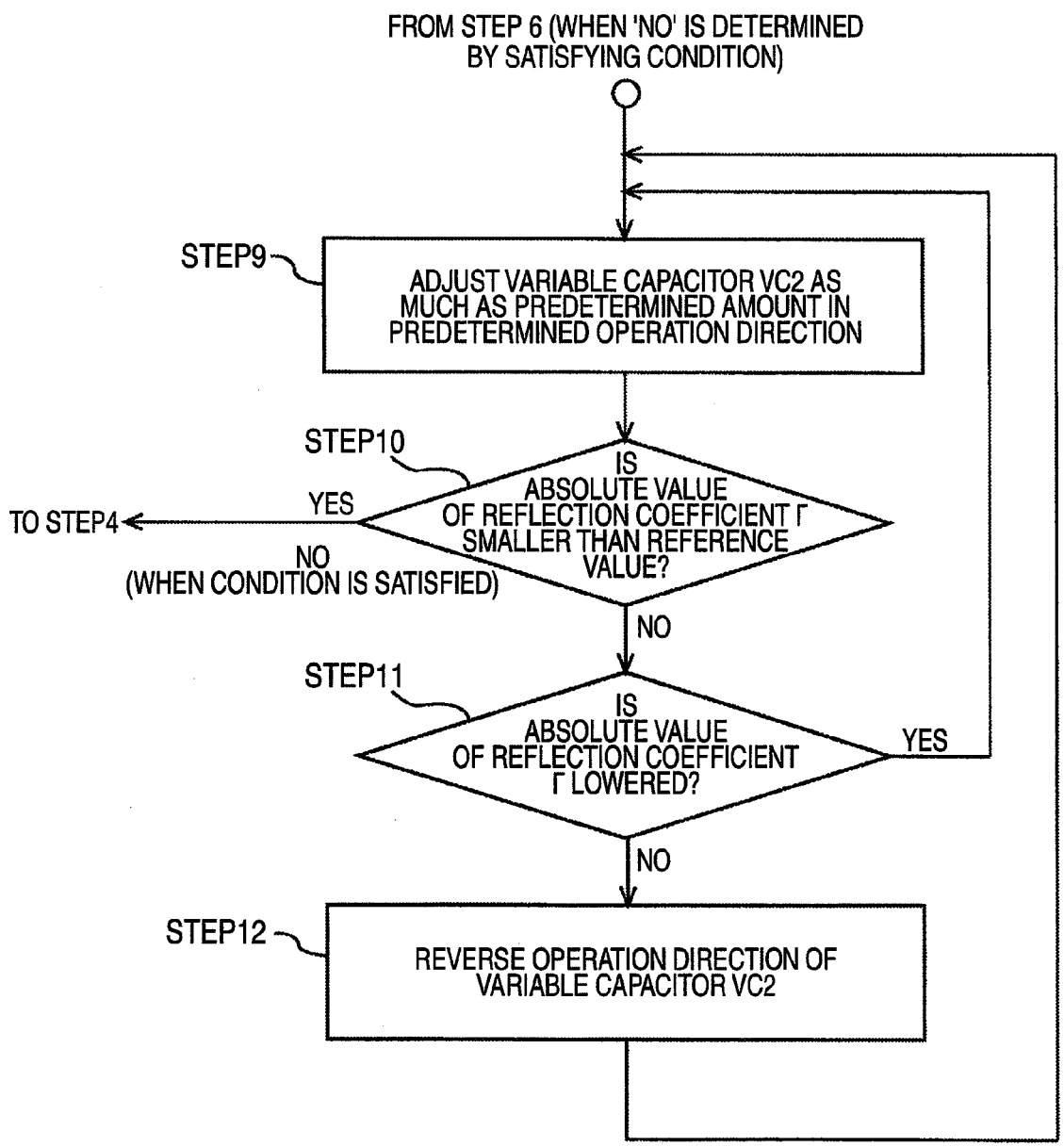
FIG. 6 is an exemplary flowchart illustrating a control method of decreasing an absolute value of reflection coefficient $\Gamma$ by using the high frequency device according to the second embodiment of the invention.
Figure 7:
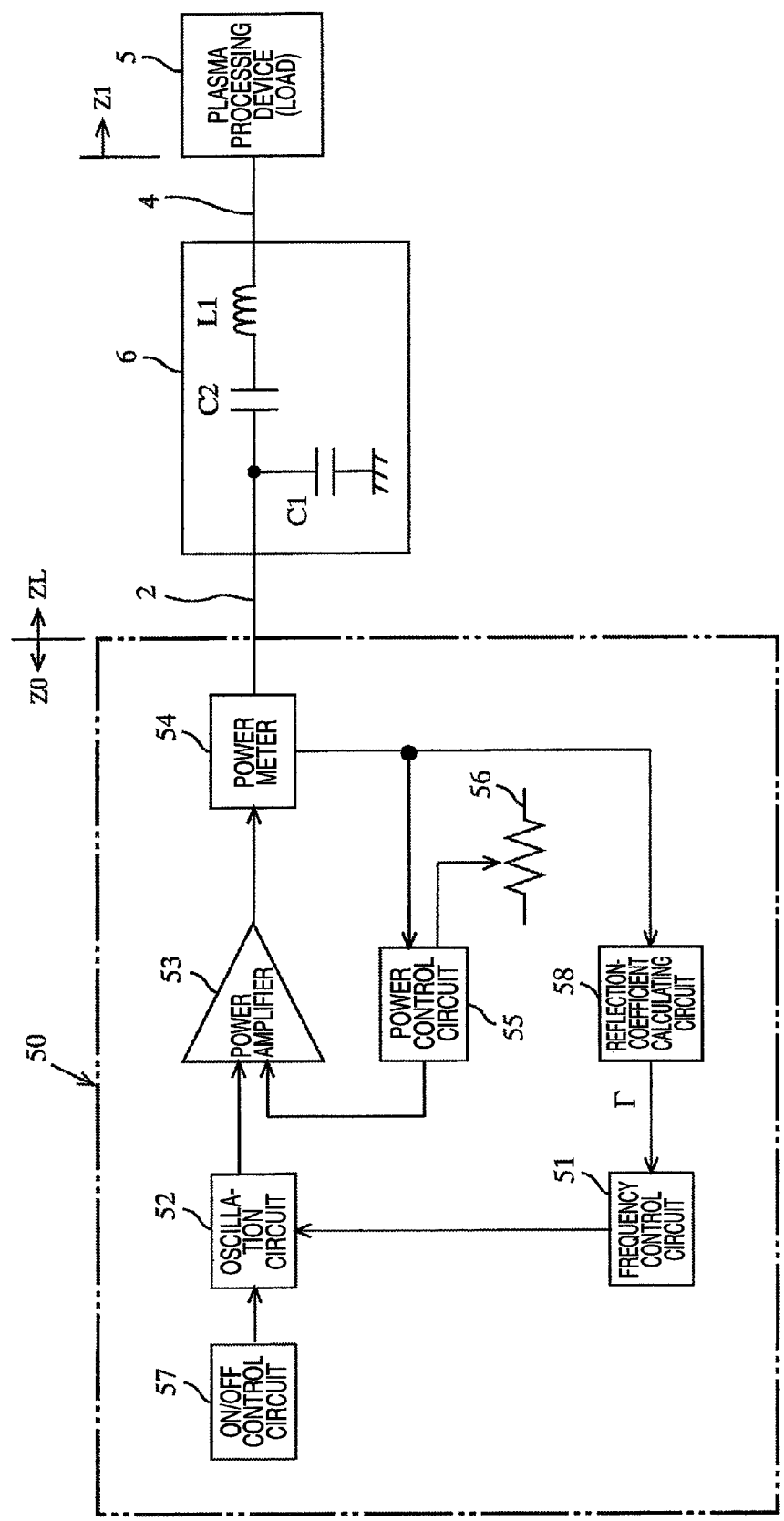
FIG. 7 is a diagram illustrating an exemplary configuration of a known high frequency device and connection relation between the high frequency device and the load 5.

FIG. 6 is an exemplary flowchart illustrating a control method of decreasing an absolute value of reflection coefficient $\Gamma$ by using the high frequency device according to the second embodiment of the invention. A control operation for decreasing the absolute value of reflection coefficient r will be described with reference to the flowchart. The flowchart mainly explains a control method in which capacitance of the variable capacitor VC2 is changed. The control operation is inserted while the special example (when the condition is satisfied even in 'No' state, the step moves to Step 4 or Step 2) in Step 6 moves to Step 4 as shown in the flowchart in FIG. 2, and thus FIG. 6 shows the flowchart of the inserted control operation by extracting the part thereof.

Step 9: when the condition of the special example (when the condition is satisfied even in 'No' state, the step moves to Step 4 or Step 2) shown in Step 6 of FIG. 2 is satisfied, the current step moves from Step 6 to Step 9 of FIG. 6, and Steps 9 to 12 are performed in order to adjust capacitance of the variable capacitor VC2. In Step 9, the variable capacitor VC2 is adjusted as much as a predetermined amount in a predetermined operation direction. Additionally, an initial value thereof is set so as to lower the capacitance. As might be expected, the initial value may be adjusted in a direction for increasing the capacitance.

Step 10: it is determined whether the absolute value of reflection coefficient $\Gamma$ becomes smaller than the reference value or not, from the result that the variable capacitor VC2 is operated in Step 9. When the absolute value of reflection coefficient $\Gamma$ is less than the reference value (Yes), the process proceeds to Step 4 in FIG. 2 since the absolute value of reflection coefficient $\Gamma$ becomes small. When the absolute value of reflection coefficient $\Gamma$ is not less than the reference value (No), the process proceeds to Step 11 in order to determine whether the operation amount of the variable capacitor VC1 is small or not.

Additionally, in Step 10, when the case where the absolute value of reflection coefficient $\Gamma$ is not less than the reference value (No) is continuously repeated a predetermined number of times, it may be preferable to perform the control operation of output frequency of the high-frequency power supplier 1. Hence, the current step may move to Step 4. A criteria of the process may be set not only when the aforementioned case is continuously repeated a predetermined number of times, but also, for example, when the absolute value of reflection coefficient $\Gamma$ is not less than the reference value during a predetermined time. In this case, a timer is disposed therein. That is, when a predetermined condition is satisfied even though the absolute value of reflection coefficient $\Gamma$ is not less than the reference value (No), the current step may move to Step 4. Additionally, this case corresponds to the case where the absolute value of reflection coefficient r becomes larger than the reference value in Step 4 (Yes), and thus the process proceeds to Step 2. Hence, Step 10 may move to Step 2.

Additionally, in Step 10 as described above, when a predetermined condition is satisfied in the case where the absolute value of reflection coefficient $\Gamma$ is not less than the reference value (No) (for example, when the case is continuously repeated a predetermined number of times), there is a possibility that some kinds of error occur, and thus it is preferable to output error signal. The output of the high frequency power of the high-frequency power supplier 1 may be stopped by the error signal.

Step 11: it is determined whether the absolute value of reflection coefficient $\Gamma$ lowers or not, from the result that the variable capacitor VC2 is operated. When the absolute value of reflection coefficient $\Gamma$ lowers (Yes), there is a possibility that the operation amount of the variable capacitor VC2 is small, and thus the process proceeds to Step 9. When the absolute value of reflection coefficient $\Gamma$ does not lower (No), the process proceeds to the Step 12 since there is a possibility that the operation direction of the variable capacitor VC2 is not right.

Step 12: When the absolute value of reflection coefficient $\Gamma$ does not lower (No) in Step 7, there is a possibility that the operation direction of the variable capacitor VC2 is not right, and thus the process proceeds to Step 9 by reversing the operation direction of the variable capacitor VC2. From the next time, the reversed operation direction in this step becomes an operation direction. Additionally, since the absolute value of reflection coefficient $\Gamma$ varies every moment, when the process of Step 12 is strictly performed, the operation direction repeatedly changes like normal direction→reverse direction→normal direction→reverse direction . . . , so sometimes the control may become unstable. Hence, in order to contrive stability of the control, for example, the same operation direction may be maintained until the case of No continues a predetermined times.

According to the control operation as described above, even when the variable frequency type high-frequency power supplier is employed and an auto impedance matcher is not employed, it is possible to control both resistance component R and reactance component X of the load side impedance, and thus it is also possible to lower the reflected wave power.

In the second embodiment, the reactance element control circuit 19 simultaneously controls one variable reactance element while the high frequency power is supplied to the load. Hence, it is comparatively easy to control the variable reactance element. Moreover, adjustment of the resistance component R can be performed by a simple control operation. As a result, throughout the entire manufacturing process, even when a load has characteristics that the load impedance Z1 greatly varies, it is possible to lower the reflected wave power. It may be also possible to perform the control operation so as to lower the absolute value of reflection coefficient.

Additionally, the invention is not limited to the configuration of the reactance element of the impedance adjuster 3 as shown in FIG. 1, and may be modified to various configurations of the impedance adjuster 3.

In the impedance adjuster 3 as shown in FIG. 1, the reactance of the capacitor C2 or the inductor L1 is fixed, but it may be also possible to use a variable reactance. However, in any cases, the reactance element control circuit 19 simultaneously controls one variable reactance element while the high frequency power is supplied to the load. Hence, it is comparatively easy to control the variable reactance element.

Additionally, it can be considered that two or more variable reactance elements are driven by one motor. For example, instead of the variable capacitor VC2, two variable capacitors are connected in parallel, and the capacitors can be driven by a motor. In this case, when the two variable capacitors connected in parallel is considered as one variable reactance element, the control operation can be performed in the same manner as described above.

What is claimed is:

1. A high frequency device for supplying a high frequency power to a load, the high frequency device comprising:
   an oscillator that varies an oscillation frequency;
   a high frequency power supplier that serves as a power source by amplifying an oscillation signal output from the oscillator for supplying the high frequency power to the load;
   a reflected-wave information calculator that calculates reflected wave information on a reflected wave power, and outputs the reflected wave information;
   a frequency controller that controls the oscillation frequency of the oscillator so as to lower the reflected wave information;
   an impedance adjuster that is positioned downstream of the high frequency power supplier in a power supplying direction, and that includes at least one controllable variable reactance element; and
   an element controller that controls the controllable variable reactance element of the impedance adjuster so as to lower the reflected wave information,
   wherein:
   the element controller starts controlling the controllable variable reactance element when the reflected wave information has not become smaller than a reference value by controlling, by the frequency controller, the oscillation frequency of the oscillator so as to lower the reflected wave information,
   the frequency controller does not control the oscillation frequency of the oscillator while the element controller controls the controllable variable reactance element,
   the load includes a plasma processing device, and the frequency controller varies the oscillation frequency of the oscillator so as to reduce the reflected wave information after the plasma processing device starts discharging, and
   the frequency controller varies the oscillation frequency of the oscillator so as to reduce the reflected wave information after the plasma processing device starts discharging and before the plasma processing device stops discharging.

2. The high frequency device according to claim 1, wherein the frequency controller restarts a control operation when the reflected wave information becomes larger than the reference value again, after the element controller controls the controllable variable reactance element of the impedance adjuster so as to lower the reflected wave information and then the reflected wave information becomes smaller than the reference value.

3. The high frequency device according to claim 1, wherein the frequency controller restarts a control operation when the reflected wave information has not become smaller than a reference value although the element controller has controlled the controllable variable reactance element of the impedance adjuster so as to lower the reflected wave information.

4. The high frequency device according to claim 1, wherein the controllable variable reactance element of the impedance adjuster changes a resistance component of an impedance at a load side rather than the high frequency power supplier.

5. A high frequency device for supplying high frequency power to a load, the high frequency device comprising:
   an oscillator that can vary an oscillation frequency;
   a high frequency power supplier that serves as a power source by amplifying an oscillation signal output from the oscillator for supplying the high frequency power to the load;
   a reflected-wave information calculator that calculates reflected wave information on a reflected wave power, and outputs the reflected wave information;
   a frequency controller that controls the oscillation frequency of the oscillator so as to lower the reflected wave information;
   an impedance adjuster that is positioned downstream of the high frequency power supplier in a power supplying direction, and that has a plurality of variable reactance elements including two controllable variable reactance elements; and
   an element controller that controls any one of the two controllable variable reactance elements of the impedance adjuster at a time so as to lower the reflected wave information,
   wherein:
   the element controller starts controlling one of the two controllable variable reactance elements which can be controlled when the reflected wave information has not become smaller than a reference value by controlling, by the frequency controller, the oscillation frequency of the oscillator so as to lower the reflected wave information,
   the frequency controller does not control the oscillation frequency of the oscillator while the element controller controls the controllable variable reactance element,
   the load includes a plasma processing device, and the frequency controller varies the oscillation frequency of the oscillator so as to reduce the reflected wave information after the plasma processing device starts discharging, and the frequency controller varies the oscillation frequency of the oscillator so as to reduce the reflected wave information after the plasma processing device starts discharging and before the plasma processing device stops discharging.

6. The high frequency device according to claim 5, wherein the element controller starts controlling the other of the two controllable variable reactance elements when the reflected wave information has not become smaller than a reference value although the one of the two controllable variable reactance elements of the impedance adjuster has been controlled to lower the reflected wave information.

7. The high frequency device according to claim 5, wherein the frequency controller restarts a control operation when the reflected wave information becomes larger than the reference value again, after the element controller controls the controllable variable reactance element of the impedance adjuster so as to lower the reflected wave information and then the reflected wave information becomes smaller than the reference value.

8. The high frequency device according to claim 5, wherein the frequency controller restarts a control operation when the reflected wave information does not become smaller than the reference value although the element controller has controlled the controllable variable reactance element of the impedance adjuster so as to lower the reflected wave information.

9. The high frequency device according to claim 5, wherein the one of the two controllable variable reactance elements of the impedance adjuster changes a resistance component of an impedance at a load side rather than the high frequency power supplier, and the other of the two controllable variable reactance elements changes a reactance component of the impedance at the load side rather than the high frequency power supplier.

10. A high frequency device for supplying a high frequency power to a load, the high frequency device comprising:
an oscillator that varies an oscillation frequency;
a high frequency power supplier that serves as a power source by amplifying an oscillation signal output from the oscillator for supplying the high frequency power to the load;
a reflected-wave information calculator that calculates reflected wave information on a reflected wave power, and outputs the reflected wave information;
a frequency controller that controls the oscillation frequency of the oscillator so as to lower the reflected wave information;
an impedance adjuster that is positioned downstream of the high frequency power supplier in a power supplying direction, and that includes at least one controllable variable reactance element; and
an element controller that controls the controllable variable reactance element of the impedance adjuster so as to lower the reflected wave information,
wherein:
the element controller starts controlling the controllable variable reactance element when the reflected wave information has not become smaller than a reference value by controlling, by the frequency controller, the oscillation frequency of the oscillator so as to lower the reflected wave information,
the frequency controller does not control the oscillation frequency of the oscillator while the element controller controls the controllable variable reactance element,
the load includes a plasma processing device, and the frequency controller varies the oscillation frequency of the oscillator so as to reduce the reflected wave information after the plasma processing device starts discharging, and
the frequency controller varies the oscillation frequency of the oscillator so as to reduce the reflected wave information immediately after the plasma processing device starts discharging.

11. A high frequency device for supplying high frequency power to a load, the high frequency device comprising:
an oscillator that can vary an oscillation frequency;
a high frequency power supplier that serves as a power source by amplifying an oscillation signal output from the oscillator for supplying the high frequency power to the load;
a reflected-wave information calculator that calculates reflected wave information on a reflected wave power, and outputs the reflected wave information;
a frequency controller that controls the oscillation frequency of the oscillator so as to lower the reflected wave information;
an impedance adjuster that is positioned downstream of the high frequency power supplier in a power supplying direction, and that has a plurality of variable reactance elements including two controllable variable reactance elements; and
an element controller that controls any one of the two controllable variable reactance elements of the impedance adjuster at a time so as to lower the reflected wave information,
wherein:
the element controller starts controlling one of the two controllable variable reactance elements which can be controlled when the reflected wave information has not become smaller than a reference value by controlling, by the frequency controller, the oscillation frequency of the oscillator so as to lower the reflected wave information,
the frequency controller does not control the oscillation frequency of the oscillator while the element controller controls the controllable variable reactance element,
the load includes a plasma processing device, and the frequency controller varies the oscillation frequency of the oscillator so as to reduce the reflected wave information after the plasma processing device discharging, and
wherein the frequency controller varies the oscillation frequency of the oscillator so as to reduce the reflected wave information immediately after the plasma processing device starts discharging.

12. A high frequency device for supplying a high frequency power to a load, the high frequency device comprising:
an oscillator that varies an oscillation frequency;
a high frequency power supplier that serves as a power source by amplifying an oscillation signal output from the oscillator for supplying the high frequency power to the load;
a reflected-wave information calculator that calculates reflected wave information on a reflected wave power, and outputs the reflected wave information;
a frequency controller that controls the oscillation frequency of the oscillator so as to lower the reflected wave information;
an impedance adjuster that is positioned downstream of the high frequency power supplier in a power supplying direction, and that includes at least one controllable variable reactance element; and an element controller that controls the controllable variable reactance element of the impedance adjuster so as to lower the reflected wave information, wherein:

the element controller starts controlling the controllable variable reactance element when the reflected wave information has not become smaller than a reference value by controlling, by the frequency controller, the oscillation frequency of the oscillator so as to lower the reflected wave information, the frequency controller does not control the oscillation frequency of the oscillator while the element controller controls the controllable variable reactance element, the load includes a plasma processing device, and the frequency controller varies the oscillation frequency of the oscillator so as to reduce the reflected wave information after the plasma processing device starts discharging, and the frequency controller varies the oscillation frequency of the oscillator so as to reduce the reflected wave information during the period that the plasma processing device is discharging and the element controller does not control the controllable variable reactance element.

13. A high frequency device for supplying high frequency power to a load, the high frequency device comprising:

an oscillator that can vary an oscillation frequency;

a high frequency power supplier that serves as a power source by amplifying an oscillation signal output from the oscillator for supplying the high frequency power to the load;

a reflected-wave information calculator that calculates reflected wave information on a reflected wave power, and outputs the reflected wave information;

a frequency controller that controls the oscillation frequency of the oscillator so as to lower the reflected wave information;

an impedance adjuster that is positioned downstream of the high frequency power supplier in a power supplying direction, and that has a plurality of variable reactance elements including two controllable variable reactance elements; and an element controller that controls any one of the two controllable variable reactance elements of the impedance adjuster at a time so as to lower the reflected wave information, wherein:

the element controller starts controlling one of the two controllable variable reactance elements which can be controlled when the reflected wave information has not become smaller than a reference value by controlling, by the frequency controller, the oscillation frequency of the oscillator so as to lower the reflected wave information, the frequency controller does not control the oscillation frequency of the oscillator while the element controller controls the controllable variable reactance element, the load includes a plasma processing device, and the frequency controller varies the oscillation frequency of the oscillator so as to reduce the reflected wave information after the plasma processing device starts discharging, and the frequency controller varies the oscillation frequency of the oscillator so as to reduce the reflected wave information during the period that the plasma processing device is discharging and the element controller does not control the controllable variable reactance element.

* * * * *

UNITED STATES PATENT AND TRADEMARK OFFICE
CERTIFICATE OF CORRECTION

PATENT NO. : 8,203,859 B2
APPLICATION NO. : 11/954436
DATED : June 19, 2012
INVENTOR(S) : S. Omae et al.

It is certified that error appears in the above-identified patent and that said Letters Patent is hereby corrected as shown below:

At Column 18, line 48 (claim 11, line 36) of the printed patent, change "device discharging," to -- device starts discharging, --.

Signed and Sealed this
Eleventh Day of September, 2012

David J. Kappos
*Director of the United States Patent and Trademark Office*